United States Patent
Rausch et al.

(10) Patent No.: US 10,490,761 B2
(45) Date of Patent: Nov. 26, 2019

(54) LIGHT EMITTING COMPONENT HAVING A PHOSPHORESCENT AND FLUORESCENT MATERIALS IN AN EMITTER LAYER

(71) Applicant: OSRAM OLED GmbH, Regensburg (DE)

(72) Inventors: Andreas Rausch, Regensburg (DE); Diana Kuehnlein, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 295 days.

(21) Appl. No.: 15/544,536

(22) PCT Filed: Jan. 21, 2016

(86) PCT No.: PCT/EP2016/051250
§ 371 (c)(1),
(2) Date: Jul. 19, 2017

(87) PCT Pub. No.: WO2016/116570
PCT Pub. Date: Jul. 28, 2016

(65) Prior Publication Data
US 2018/0013089 A1    Jan. 11, 2018

(30) Foreign Application Priority Data
Jan. 22, 2015   (DE) .................. 10 2015 100 913

(51) Int. Cl.
  *H01L 29/08*   (2006.01)
  *H01L 21/00*   (2006.01)
  (Continued)

(52) U.S. Cl.
  CPC ...... *H01L 51/5016* (2013.01); *H01L 27/3211* (2013.01); *H01L 27/3232* (2013.01);
  (Continued)

(58) Field of Classification Search
  CPC ............. H01L 51/5016; H01L 27/3211; H01L 27/3232; H01L 27/3239; H01L 51/006;
  (Continued)

(56) References Cited

U.S. PATENT DOCUMENTS 8,981,393 B2 *   3/2015   Seo .................... H01L 51/5262
                                                        257/89
2010/0314644 A1   12/2010   Nishimura et al.
(Continued)

FOREIGN PATENT DOCUMENTS

DE   102013106992 A1   1/2015
WO   2008131750 A2   11/2008
WO   2013164647 A2   11/2013

OTHER PUBLICATIONS

German Search Report based on application No. 10 2015 100 913.7 (10 pages) dated Dec. 18, 2015.
(Continued)

*Primary Examiner* — Alonzo Chambliss
(74) *Attorney, Agent, or Firm* — Viering Jentschura & Partner MBB

(57) ABSTRACT

A light-emitting component provides an emitter layer including phosphorescent and fluorescent emitter materials, and at least one predefined first and second display regions. The first region has both emitter materials. The second region has the phosphorescent emitter material. A first electromagnetic radiation is emitted upon the transition from the first excited state to the ground state of the phosphorescent emitter material. A second electromagnetic radiation is emitted upon the transition from the excited state to the ground state of the fluorescent emitter material. The excited state of the fluorescent emitter material is occupied by an energy transfer from the second excited state of the phosphorescent emitter material to the excited state of the fluorescent emitter material so that a mixed light composed
(Continued)

of first and second electromagnetic radiations is emittable from the first region, and the light that is emittable from the second region is free of second electromagnetic radiation.

20 Claims, 5 Drawing Sheets

(51) Int. Cl.
    *H01L 51/50*     (2006.01)
    *H01L 27/32*     (2006.01)
    *H01L 51/00*     (2006.01)

(52) U.S. Cl.
    CPC ........ *H01L 27/3239* (2013.01); *H01L 51/006* (2013.01); *H01L 51/0081* (2013.01); *H01L 51/0085* (2013.01); *H01L 51/5036* (2013.01); *H01L 51/5048* (2013.01); *H01L 51/5072* (2013.01); *H01L 2251/5376* (2013.01)

(58) Field of Classification Search
    CPC ............. H01L 51/0081; H01L 51/0085; H01L 51/5036; H01L 51/5048; H01L 51/5072
    See application file for complete search history.

(56) References Cited

U.S. PATENT DOCUMENTS

| | | | | |
|---|---|---|---|---|
| 2013/0256637 | A1* | 10/2013 | Seo | H01L 51/5004 257/40 |
| 2013/0277654 | A1* | 10/2013 | Seo | H01L 51/5262 257/40 |
| 2016/0064684 | A1* | 3/2016 | Seo | H01L 51/5016 257/40 |
| 2016/0190500 | A1* | 6/2016 | Watabe | C07F 15/0033 257/40 |
| 2018/0003354 | A1* | 1/2018 | Kastner-Jung | B60Q 3/745 |

OTHER PUBLICATIONS

International Search Report based on application No. PCT/EP2016/051250 (7 pages) dated May 3, 2016.

Kammoun,"Organische Leuchtdioden aus Polymeren und niedermolekularen Verbindungen für großflächige OLED-Anzeigen",Cuvillier Verlag, pp. 14-23, 2008.

* cited by examiner

LIGHT EMITTING COMPONENT HAVING A PHOSPHORESCENT AND FLUORESCENT MATERIALS IN AN EMITTER LAYER

RELATED APPLICATIONS

The present application is a national stage entry according to 35 U.S.C. § 371 of PCT application No.: PCT/EP2016/051250 filed on Jan. 21, 2016, which claims priority from German application No.: 10 2015 100 913.7 filed on Jan. 22, 2015, and is incorporated herein by reference in its entirety.

TECHNICAL FIELD

The present disclosure relates to a light-emitting component, a method for producing a light-emitting component and a method for operating a light-emitting component.

BACKGROUND

In a conventional organic light-emitting component, for example an organic light-emitting diode (OLED), an emitter layer is arranged between an anode and a cathode, electromagnetic radiation being generated in said emitter layer. Applications for OLEDs are for example use as surface light sources in general lighting, as backlighting or pixels in displays or for representing information on signs or displays (signage applications).

In signage applications based on OLEDs, in one conventional method the emitter layer is structured after the formation of the OLED by means of a laser in order to represent the information in the OLED. In a further conventional method, the emitter layer is structured by the use of a condensed resist gas with subsequent lift-off patterning. In a further conventional method, the representation of the information is realized by means of partial modification of the injectability of charge carriers from one of the electrodes into the emitter layer. In a further method, the information is represented by means of a series connection of individually shaped OLED elements.

However, the conventional methods are comparatively cost-intensive and technically demanding, in particular for signage applications.

SUMMARY

The object of the present disclosure is to provide a light-emitting component, a method for producing a light-emitting component and a method for operating a light-emitting component with which information is representable in an electrically switchable manner and which is implementable in a technically simple manner.

The object is achieved in accordance with one aspect of the present disclosure by means of a light-emitting component having an emitter layer, wherein the emitter layer includes a first emitter material and a second emitter material. The emitter layer includes at least one predefined first display region and a second display region. The first display region includes the first emitter material and the second emitter material, and the second display region includes the first emitter material and is substantially free of the second emitter material. The first emitter material has at least one first excited state and a second excited state, wherein the second excited state is energetically above the first excited state, and a first electromagnetic radiation is emitted upon the transition from the first excited state to the ground state of the first emitter material. The second emitter material has at least one excited state, wherein a second electromagnetic radiation is emitted upon the transition from the excited state of the second emitter material to the ground state of the second emitter material. The excited state of the second emitter material is occupied substantially by means of an energy transfer from the second excited state of the first emitter material to the excited state of the second emitter material in such a way that a mixed light composed of first electromagnetic radiation and second electromagnetic radiation is emittable from the first display region, and the light that is emittable from the second display region is substantially free of second electromagnetic radiation.

In other words: the second excited state of the first emitter material is not formed by direct electron-hole recombination. The second excited state of the first emitter material is occupied for example indirectly, for example by means of a triplet-triplet annihilation of two adjacent excited molecules of the first emitter material. As a result, a third excited state partly forms, said third excited state lying energetically above the second excited state, wherein the third excited state transitions to the second excited state by means of energy transfer.

An excited state is an excited state in the energized and non-energized states of the light-emitting component.

A display region of a light-emitting component is a region for displaying or representing information. In various developments, the light-emitting component includes at least two display regions, for example a multiplicity of display regions. The multiplicity of display regions includes at least one first display region and a second display region, for example a multiplicity of first display regions and a multiplicity of second display regions. An individual display region has, or the individual display regions have, in each case a dimensioning that is large enough, for example at least a few $\mu m^2$ to $m^2$, to enable the information displayed in the respective display region to be perceived optically by itself, for example with the naked eye. In other words: a display region is perceptible as a region that displays discrete information, for example with respect to a directly adjacent display region.

By way of example, in the case of a simply constructed monochromatic organic light-emitting diode, the first emitter material or an optional matrix material (as will be described even more thoroughly below) of the emitter layer is formed such that it is doped with a phosphorescent first emitter material substantially over the whole area. In a first display region of the light-emitting area of the light-emitting component, the matrix material of the emitter layer is formed such that it is additionally doped with a highly energetic second emitter material. If the light-emitting component is operated with an electric current having a low electric current intensity or current density (below a threshold value), the emitted light results substantially exclusively from the first emitter material. The light-emitting component emits light homogeneously substantially over the whole area. If the current intensity or current density is increased (above the threshold value), the excited, light-emitting state of the more highly energetic, second emitter material is occupied, such that the second emitter material also emits light (second electromagnetic radiation). The total brightness of the emitted light of the light-emitting component is increased as a result. In addition, the emitted light of the first display region has a different color than the emitted light of the second display region, for the case where the first electromagnetic radiation and the second electromagnetic radiation are of different colors. By means of the color contrast of first display region and second display region, information, for example a symbol, a pictogram, lettering or the like, can be represented in an electrically switchable manner by means of the shape of the first display region. A reduction of the electric current intensity (below the threshold value) causes the light-emitting component once again to emit light homogeneously in a monochromatic fashion. The process described is thus reversible as often as desired. The threshold value is dependent on the probability of occupation of the first excited state of the first emitter material, on the rate of triplet-triplet annihilation, on the emitter concentrations used, and on the emission decay durations of the emitter materials used.

The threshold value can be determined empirically for a light-emitting component. The threshold value can be for example a current density of greater than or equal to 1 mA/cm$^2$, for example greater than or equal to 10 mA/cm$^2$, for example greater than or equal to 50 mA/cm$^2$.

By means of the light-emitting component, information, for example for signage applications, can thus be representable without complex structuring processes for the emitter layer. The second emitter material can be embedded in the first display region for example by means of a simple shadow mask process during the production of the emitter layer in the matrix material. A light-emitting component having a very simple structure with a single emitter layer can thus suffice for representing information. The construction of the light-emitting component makes it possible for the representation of information, for example of a logo, of a symbol, of a pictogram or of lettering, to be electrically switched on and off in a continuously variable manner.

In accordance with one development, the first emitter material furthermore has at least one third excited state, which lies energetically above the second excited state. The second excited state can be occupied from the third excited state. The second excited state can be occupied for example by means of internal conversion.

In accordance with one development, the third excited state is occupied by means of a bimolecular quenching process of first excited states.

In accordance with one development, the emitter layer includes a matrix material, wherein the first emitter material and the second emitter material are distributed in the matrix material.

In accordance with one development, the light emittable by the second display region substantially only includes the first electromagnetic radiation.

In accordance with one development, the energy level of the excited state of the second emitter material is energetically between the energy level of the first excited state and the energy level of the second excited state of the first emitter material.

In accordance with one development, the energy difference between the excited state of the second emitter material and the ground state of the second emitter material is greater than the energy difference between the first excited state of the first emitter material and the ground state of the first emitter material.

In other words: the first electromagnetic radiation and the second electromagnetic radiation have a different color locus. The second electromagnetic radiation has a shorter wavelength range than the first electromagnetic radiation.

In accordance with one development, the first display region and the second display region are arranged alongside one another, for example in a plane of the emitter layer.

In accordance with one development, the first emitter material is a phosphorescent material, and the first electromagnetic radiation is a phosphorescent light.

The phosphorescent light has a relatively long decay time, for example a decay time of greater than 100 µs.

As a result, the number of occupied, excited states of the second emitter material can be increased by increasing the current density through the emitter layer.

In accordance with one development, the second emitter material is a fluorescent material, and the second electromagnetic radiation is a fluorescent light.

The fluorescent light has a relatively short decay time, for example a decay time of less than 100 ns.

As a result, a significant portion of the excited and occupied states of the second emitter material can contribute to the emission of the second electromagnetic radiation.

In accordance with one development, the first display region and the second display region are arranged with respect to one another such that predefined information is representable by means of the arrangement during energized operation of the light-emitting component.

In accordance with one development, the arrangement of the first display region and of the second display region with respect to one another embodies the form of lettering, of a pictogram, of a logo, of an ideogram and/or of a symbol.

In accordance with one development, the second emitter material in the first display region is distributed homogeneously in the matrix material.

This enables a sharp contour or a defined (continuous) transition from the first display region to the second display region.

In accordance with one development, the second emitter material in the first display region is distributed inhomogeneously in the the matrix material.

This enables a physiologically pleasant perception of information and/or various design possibilities.

In accordance with one development, the first display region has a number density gradient of second emitter material in the matrix material.

This has the advantage that a predefined symbol can be inserted in a continuously variable manner during operation, i.e. with a diffusely appearing transition to the second display region. The use of concentration gradients enables continuously variable insertions of information in the light-emitting area of the light-emitting component, for example by means of color gradients.

The object is achieved in accordance with a further aspect of the present disclosure by means of a method for producing a light-emitting component having an emitter layer. Forming the emitter layer is carried out with a first emitter material and a second emitter material. The emitter layer is formed at least with a predefined first display region and a second display region. The first emitter material and the second emitter material are arranged in the first display region, and the first emitter material is arranged in the second display region and the second display region is substantially free of the second emitter material. The first emitter material has at least one first excited state and a second excited state, wherein the second excited state is energetically above the first excited state, and a first electromagnetic radiation is emitted upon the transition from the first excited state to the ground state of the first emitter material. The second emitter material has at least one excited state, wherein a second electromagnetic radiation is emitted upon the transition from the excited state of the second emitter material to the ground state of the second emitter material. The excited state of the second emitter material is occupied substantially by means of an energy transfer from the second excited state of the first emitter material to the excited state of the second emitter material in such a way that a mixed light composed of first electromagnetic radiation and second electromagnetic radiation is emittable from the first display region, and the light that is emittable from the second display region is substantially free of second electromagnetic radiation.

This enables simple production of a light-emitting component with electrically switchable representation of information.

The object is achieved in accordance with a further aspect of the present disclosure by means of a method for operating a light-emitting component in accordance with one of the developments mentioned above. The method includes forming an electric current having a current density through the emitter layer, wherein at the current density the first emitter material emits the first electromagnetic radiation and the second emitter material is non-light-emitting.

In other words: the current density is lower than a threshold value, wherein the excited state of the second emitter material is occupied by electrons to an appreciable extent starting from the threshold value.

In accordance with one development, the method furthermore includes changing the current density to a second current density, wherein at the second current density the first emitter material emits the first electromagnetic radiation and the second emitter material emits the second electromagnetic radiation.

In other words: the second current density is greater than the threshold value.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
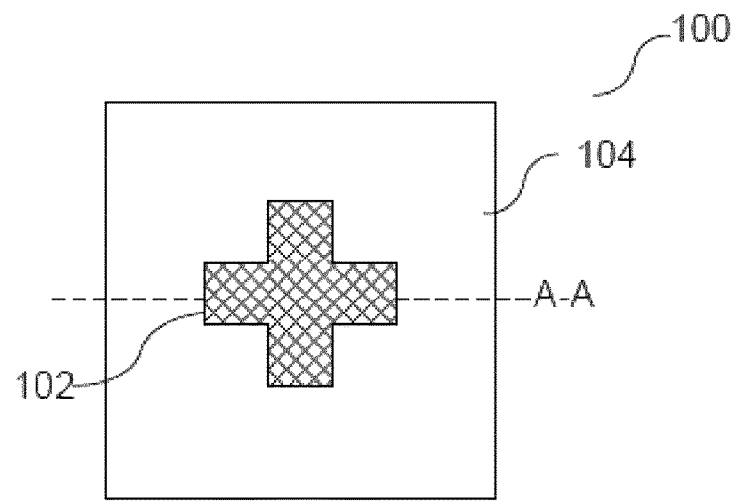
FIG. 1 shows a schematic plan view and a sectional view A-A of a light-emitting component in accordance with various developments.
Figure 1:
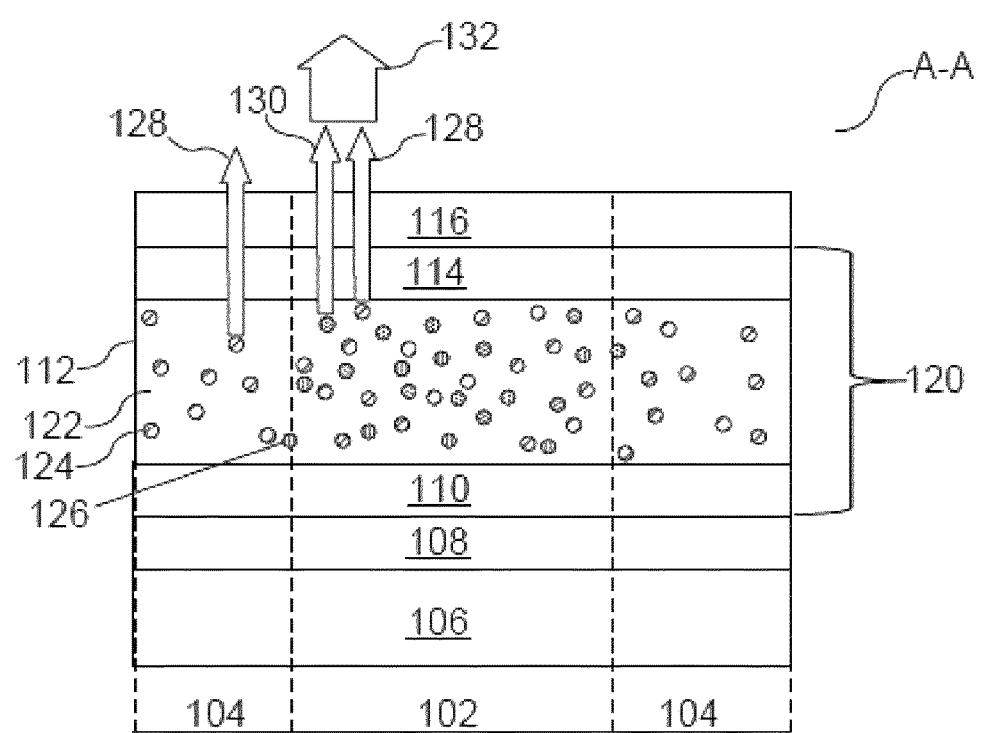

In the following detailed description, reference is made to the accompanying drawings, which form part of this description and show for illustration purposes specific embodiments in which the present disclosure can be implemented. In this regard, direction terminology such as, for instance "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

A light-emitting component may include one, two or more light-emitting components. Optionally, a light-emitting component may also include one, two or more electronic components. An electronic component may include for example an active and/or a passive component. An active electronic component may include for example a computing, control and/or regulating unit and/or a transistor. A passive electronic component may include for example a capacitor, a resistor, a diode or a coil.

In various embodiments, a light-emitting component can be an electromagnetic radiation-emitting semiconductor component and/or be formed as an electromagnetic radiation-emitting diode, as an organic electromagnetic radiation-emitting diode, as an electromagnetic radiation-emitting transistor or as an organic electromagnetic radiation-emitting transistor.

The light emitted by the light-emitting component is an electromagnetic radiation, for example light in the visible wavelength range, UV light and/or infrared light. In this context, the light-emitting component can be formed for example as a light-emitting diode (LED), as an organic light-emitting diode (OLED), as a light-emitting transistor or as an organic light-emitting transistor. In various embodiments, the light-emitting component can be part of an integrated circuit. Furthermore, a plurality of light-emitting components can be provided, for example in a manner accommodated in a common housing.

The light-emitting component can be for example a display, a pixel or a backlighting unit of a display. Alternatively or additionally, the light-emitting component is a general lighting unit and/or a surface light source, or a part thereof.

In various developments, the light-emitting component is formed with a large area, in a planar fashion and/or in a flexible fashion. In various developments, the light-emitting component is formed in a so-called bottom emitter design, top emitter design, bidirectionally emitting design and/or in a transparent fashion. The light emitted by the light-emitting component is emitted for example through the carrier (bottom emitter); in the direction of the side facing away from the carrier (top emitter); in both directions (bidirectionally) or in a plurality of or many directions (omnidirectionally), simultaneously or successively.

FIG. 1 shows a schematic plan view and a sectional view A-A of a light-emitting component 100 in accordance with various developments.

The plan view of the light-emitting component 100 illustrates that the light-emitting component includes a light-emitting region having a first display region 102 and a second display region 104.

The sectional view A-A illustrates that the light-emitting component 100 includes at least one carrier 106, a first electrode layer 108, an organic functional layer structure 120 and a second electrode layer 116.

The first electrode layer 108 is formed on the carrier 106. The first electrode layer 108 can cover a main area of the carrier 106 substantially over the whole area.

The organic functional layer structure 120 is formed on the first electrode layer 108. The organic functional layer structure 120 is physically and electrically connected to the first electrode layer 108. The organic functional layer structure 120 can cover a main area of the first electrode layer 108 substantially over the whole area, apart from a contact region of the light-emitting component 100.

The second electrode layer 116 is formed on the organic functional layer structure 120. The second electrode layer 116 can cover a main area of the organic functional layer structure 120 substantially over the whole area. Furthermore, the second electrode layer 116 can be partly formed on the carrier 106, for example in the contact region of the light-emitting component 100. The second electrode layer 116 is physically and electrically connected to the organic functional layer structure 120.

The second electrode layer 116 is electrically insulated from the first electrode layer 108 and is arranged at a distance from the latter. The organic functional layer structure 120 is electrically connected to the first electrode layer 108 and the second electrode layer 116, and is arranged in a sandwich-like fashion between the first electrode layer 108 and the second electrode layer 116.

The organic functional layer structure 120 of the light-emitting component 100 is formed for emitting an electromagnetic radiation from an electrical energy provided by means of the electrode layer 108, 116. The organic functional layer structure 120 includes for example at least one light-emitting layer 112, also designated as emitter layer 112. The emitter layer 112 includes a matrix material 122, in which at least one first emitter material 124 and a second emitter material 126 are embedded. The emitter layer 112 is formed in a structured fashion in such a way that it includes a first display region 102 and a second display region 104. The first display region 102 is arranged in the emitter layer laterally alongside the second display region 104, and vice versa. By way of example, the first display region 102 is surrounded by the second display region 104.

The matrix material 122 is substantially optically transparent. The first emitter material 124 is configured for emitting a first electromagnetic radiation 128 and the second emitter material 126 is configured for emitting a second electromagnetic radiation 130.

FIG. 1 illustrates the light-emitting component 100 in the so-called top emitter design, in which light is not emitted through the carrier 106, but rather through the second electrode layer 116. Alternatively or additionally, light emitted by the light-emitting component 100 is emitted through the carrier 106, for example by virtue of the light-emitting component 100 being formed in a so-called bottom emitter design and/or being formed such that it emits light bidirectionally or omnidirectionally. Alternatively or additionally, the light-emitting component 100 is formed in a transparent fashion.

The emitter layer 112 is formed in a structured fashion in such a way that the first display region 102 includes the first emitter material 124 and the second emitter material 126, and the second display region 104 includes the first emitter material 124 and is substantially free of second emitter material 126. By way of example, the first emitter material 124 in the first display region forms a matrix for the second emitter material 126.

By way of example, the emitter layer 112 includes a matrix material 122 and the emitter layer 112 is formed in a structured fashion in such a way that the first display region 102 embedded in the matrix material 122 includes the first emitter material 124 and the second emitter material 126, and the second display region 104 embedded in the matrix material 122 includes the first emitter material 124 and is substantially free of second emitter material 126.

In other words: the light-emitting component 100 is formed in a structured fashion in such a way that a mixed light 132 is emittable in or from the first display region 102, wherein the mixed light 132 includes at least the first electromagnetic radiation 128 and the second electromagnetic radiation 130; and the light generated in the second display region 104 or the light emitted therefrom is substantially free of second electromagnetic radiation 130, for example by virtue of the fact that substantially only first electromagnetic radiation 128 is emittable from the second display region 104.

The first emitter material 124 can emit the first electromagnetic radiation 128 by means of an electric current from the first electrode layer 108 through the organic functional layer structure 120 to the second electrode layer 116 (or in the opposite direction). In other words: the first electromagnetic radiation 128 is generated substantially by means of electroluminescent excitation of the first emitter material 124.

The second emitter material 126 is chosen in relation to the first emitter material 124 in such a way that the second emitter material 126 is put into an excited state of the second emitter material 126 by means of a transition from an excited state of the first emitter material 124, for example into an excited state by means of an intermolecular energy transfer from an excited state of the first emitter material 124 generated by triplet-triplet annihilation and subsequent internal conversion. The second electromagnetic radiation 130 is generated by means of a transfer from this excited state of the second emitter material 126 to the ground state of the second emitter material 126. In other words: the second electromagnetic radiation 130 is generated substantially by means of indirect excitation of the second emitter material 124 from an excited state of the first emitter material 124. The method of generating the electromagnetic radiation 128, 130 will be described even more thoroughly below.

In accordance with various developments described above, the carrier 106 is formed for example as a film or a sheet. Alternatively or additionally, the carrier 106 includes or is formed from a glass or a plastic. The carrier 106 can be formed in an electrically conductive fashion, for example as a metal film or a glass or plastics substrate 106 having a conductor structure. The carrier 106 includes or is formed from glass, quartz and/or a semiconductor material. Alternatively or additionally, the carrier 106 includes or is formed from a plastics film or a laminate including one or including a plurality of plastics films. The carrier 106 can be formed in a transparent fashion.

In various developments, the carrier 106 is formed such that it is mechanically flexible, for example pliable, bendable or shapeable. By way of example, the carrier 106 is configured as a film or a sheet. Alternatively or additionally, the carrier 106 includes at least one mechanically rigid, non-flexible region.

The first electrode layer 108 and/or the second electrode layer 116 can be electrically conductively connected to an electrically conductive carrier 106. As a result, by way of example a contacting of the first electrode layer 108 and/or of the second electrode layer 116 can be effected through the carrier 106, which simplifies the contact of the optoelectronic assembly 100.

The first electrode layer 108 can be formed as transparent with respect to the light emitted by the organic functional layer structure 120.

The first electrode layer 108 and the second electrode layer 116 can be formed identically or differently.

The first electrode layer 108 is formed as an anode, that is to say as a hole-injecting electrode, or as a cathode, that is to say as an electron-injecting electrode.

The first electrode layer 108 is formed in a transparent fashion in the case of emission through the carrier 106, for example from a transparent conductive oxide (TCO) or a thin metal layer, for example having a thickness of less than 100 nm. In this case, the second electrode layer 116 can be non-transparent, for example reflective, for example composed of a metal.

In various developments, the first electrode layer 108 is formed from ITO, for example.

Further examples of transparent conductive oxides are zinc oxide, tin oxide, cadmium oxide, titanium oxide, indium oxide, ternary metal-oxygen compounds such as Zn2SnO4, CdSnO3, ZnSnO3, MgIn2O4, GaInO3, Zn2O, In2O5 or In4Sn3O12 or mixtures of different transparent conductive oxides (TCO) with respect to the groups of the TCOs.

In various developments, the organic functional layer structure 120 includes (for example at least one in each case) a hole injection layer, a hole transport layer 110, an emitter layer 112, an electron transport layer and an electron injection layer 114. The layers of the organic functional layer structure 120 can have application-specifically customary layer thicknesses and materials. The layers of the organic functional layer structure 120 can be arranged between the electrode layers 108, 116 in such a way that, during operation, electrical charge carriers can flow from the first electrode layer 108 through the organic functional layer structure 120 into the second electrode layer 116, and vice versa.

As will be explained in even greater detail below, the organic functional layer structure 120 may include one or a plurality of emitter layers 112, for example including fluorescent and/or phosphorescent emitter materials 124, 126.

The emitter materials 124, 126 can form the emitter layer 112 without matrix material, i.e. in a matrix-free fashion, for example by means of coevaporation, or can be embedded in a matrix material 122 in a suitable manner.

In various developments, the emitter layer 112 is formed with first emitter material 124 and second emitter material 126. By way of example, the first emitter material 124 is formed, for example deposited, substantially over the whole area on or above the first electrode layer 108. The second emitter material 126 is formed only in the first display region 102 together with the first emitter material 124 in the matrix material 122, for example by means of coevaporation by a shadow mask process, a screenprinting method, a pad printing method or an inkjet printing method of the second emitter material onto the first emitter material 124.

In various developments, the emitter layer 112 is formed by means of doping a matrix material 122 with emitter material 124, 126. By way of example, the matrix material 122 is formed, for example deposited, substantially over the whole area on or above the first electrode layer 108. The first emitter material 124 is embedded in the matrix material 122 substantially over the whole area; by way of example, the matrix material 122 is doped with the first emitter material 124, for example by means of a coevaporation process of the first emitter material 124 and the matrix material. The second emitter material 126 is embedded only in the first display region 102 together with the first emitter material 124 in the matrix material 122, for example by means of coevaporation by a shadow mask process, a screenprinting method, a pad printing method or an inkjet printing method of the second emitter material onto the matrix material.

In other words, in various embodiments, an emitter layer including a first emitter material 124, for example a phosphorescent emitter material, which is doped with a second emitter material 126, for example a fluorescent emitter material, means that the proportion by volume of first emitter material 124 in the emitter layer 112 is greater than the proportion by volume of the second emitter material 126 in the emitter layer 112. The first emitter material 124 is thus the majority component and the second emitter material 126 is the minority component with regard to the emitter material in the emitter layer. By way of example, the proportion by volume of the second emitter material 126 is less than 0.5 times the proportion by volume of the first emitter material 124, for example less than 0.25 times, for example less than 0.1 times, for example less than 0.05 times, for example less than 0.025 times, for example less than 0.01 times, for example less than 0.001 times, for example less than 0.0001 times. The excitation of the second emitter material 126 by the first emitter material 124 is made possible as a result.

The matrix material 122 can have a larger or smaller proportion by volume in the emitter layer than the first emitter material 124.

In various developments, the matrix material 122 consists of or includes a monomeric organic molecule or a polymer. Examples of polymeric matrix materials are: polyolefins (for example high or low density polyethylene (PE) or polypropylene (PP)), polyvinyl chloride (PVC), polystyrene (PS), polyester, polycarbonate (PC), polyethylene terephthalate (PET), polyethersulfone (PES), polyethylene naphthalate (PEN), polymethyl methacrylate (PMMA), polyimide (PI), polyetherketones (PEEK), polysiloxane, for example polydimethylsiloxane (PDMS).

It should be pointed out that in addition or as an alternative to emitter materials presented below, application-specifically other suitable emitter materials, too, are likewise provided in other embodiments.

The first phosphorescent emitter material 124 and the second fluorescent emitter material 126 can be chosen with respect to one another on the basis of conventional table compilations concerning colorants and luminophores, for example by means of the Jablonski diagrams of colorants and luminophores.

In various embodiments, the first emitter material 124 includes a phosphorescent material:

Concrete examples of suitable first emitter materials 124 are: bis(3,5-difluoro-2-(2-pyridyl)phenyl-(2-carboxypyridyl)iridium(III) (FlrPic); bis(2,4-difluorophenylpyridinato)tetrakis(1-pyrazolyl)borate iridium(III) (FIr6); fac-iridium(III) tris(1-phenyl-3-methylbenzimidazolin-2-ylidene-C,C2') (fac-Ir(Pmb)3); mer-iridium(III) tris(1-phenyl-3-methylbenzimidazolin-2-ylidene-C,C2') (mer-Ir(Pmb)3); bis(2,4-difluorophenylpyridinato) (5-(pyridin-2-yl)-1H-tetrazolate)iridium(III) (FIrN4); bis(3-trifluoromethyl-5-(2-pyridyl)pyrazole) ((2,4-difluorobenzyl)diphenylphosphinate)iridium(III) (Ir(fppz)2(dfbdp)); bis(3-trifluoromethyl-5-(2-pyridyl)pyrazolate) (benzyldiphenylphosphinate)iridium(III) (Ir(fppz)2(bdp)); bis(1-(2,4-difluorobenzyl)-3-methylbenzimidazolium) (3-(trifluoromethyl)-5-(2-pyridyl)-1,2,4-triazolate)iridium(III) (Ir(fptz)(dfbmb)2); bis(4',6'-difluorophenylpyridinato)

(3,5bis(trifluoromethyl)-2(2'-pyridyl)pyrrolate)iridium(III) (Ir(dfppy)2(fpy)); bis(4',6'-difluorophenylpyridinato) (3-(trifluoromethyl)-5-(2-pyridyl)-1,2,4-triazolate) iridium(III) (Ir (dfppy)2(fptz)); fac-tris[(2,6-diisopropylphenyl)-2-phenyl-1Himidazol[e]iridium(III) (fac-Ir(iprpmi)3); fac-tris(1-phenyl-3-methylimidazolin-2-ylidene-C,C(2)'iridium(fac-Ir (pmi)3); mer-tris(1-phenyl-3-methylimidazolin-2-ylidene-C,C(2)'iridium (mer-Ir(pmi)3); bis(1-(4-fluorophenyl)-3-methylimdazoline-2-ylidene-C,C2') (3,5-dimethyl-2-(1H-pyrazol-5-yl)pyridine)iridium(III) ((fpmi)2Ir(dmpypz)); bis (1-(4-methylphenyl)-3-methylimdazolin-2-ylidene-C,C2') (3,5-dimethyl-2-(1H-pyrazol-5-yl)pyridine)iridium(III) ((mpmi)2Ir(dmpypz)); fac-tris(1,3-diphenyl-benzimidazolin-2-ylidene-C,C2')iridium(III) (fac-Ir(dpbic)3); bis(1-(4-fluorophenyl)-3-methylimdazoline-2-ylidene-C,C2') (2-(5-trifluoromethyl-2H-pyrazol-3-yl)-pyridine)iridium(III) ((fpmi)2Ir(tfpypz)); bis(1-(4-fluorophenyl)-3-methylimdazoline-2-ylidene-C,C2') (2-(1H-imidazol-2-yl)pyridine) iridium(III) ((fpmi)2Ir(pyim)); bis(1-(4-fluorophenyl)-3-methylimdazoline-2-ylidene-C,C2') (2-(2H-pyrazol-3-yl)-pyridine)iridium(III) ((fpmi)2Ir(pypz)); bis(1-(4-methylphenyl)-3-methylimdazolin-2-ylidene-C,C2') (2-(2H-pyrazol-3-yl)-pyridine)iridium(III) ((mpmi)2Ir(pypz)); bis(1-phenyl-3-methylimdazolin-2-ylidene-C,C2') (2-(2H-pyrazol-3-yl)-pyridine)iridium(III) ((pmi)2Ir(pypz)), PtOEP, further platinum complexes, further iridium complexes, ruthenium complexes, palladium complexes, gold complexes, copper complexes, osmium complexes, europium complexes, further complexes having a lanthanide central atom.

In various developments, the second emitter material 126 includes or is formed from at least one fluorescent material, e.g. from one of the following organic colorant classes: acridine, acridone, anthraquinone, anthracene, cyanine, dansyl, squaryllium, spiropyrans, boron-dipyrromethanes (BODIPY), perylenes, pyrenes, naphthalenes, flavins, pyrroles, porphyrins and the metal complexes thereof, diarylmethane, triarylmethane, nitro, nitroso, phthalocyanine, quinones, azo, indophenol, oxazines, oxazones, thiazines, thiazoles, xanthenes, fluorenes, flurones, pyronines, rhodamines, coumarins.

The second electrode layer 116 can be formed in a reflective manner. The second electrode layer 116 includes an electrically conductive material, for example a metal. Suitable metals are for example Ag, Pt, Au, Mg, Al, Ba, In, Ca, Sm or Li, and compounds, combinations or alloys thereof.

Alternatively, the second electrode layer 116 is formed such that it is transparent with respect to the light emitted and/or absorbed by the emitter layer 112.

Alternatively or additionally, the second electrode layer 116 includes a transparent conductive oxide of one of the following materials: for example metal oxides: for example zinc oxide, tin oxide, cadmium oxide, titanium oxide, indium oxide, or indium tin oxide (ITO). Alternatively or additionally, the second electrode layer has a layer thickness in a range of from one monolayer to 500 nm, for example from less than 25 nm to 250 nm, for example from 50 nm to 100 nm.

Furthermore, the light-emitting component 100 includes an encapsulation structure (not illustrated). The encapsulation structure is formed in such a way that the light-emitting component 100 is hermetically sealed with respect to indiffusion of a substance that is chemically reactive or dissolving with respect to the organic functional layer structure 120 through the encapsulation structure into the organic functional layer structure 120. In other words: the organic functional layer structure 120 is hermetically sealed by means of the encapsulation structure with respect to indiffusion of at least one substance that is harmful to the organic functional layer structure 120, for example water, sulfur, oxygen and/or compounds thereof.

A hermetically impermeable encapsulation structure has a diffusion rate with respect to water and/or oxygen of less than approximately $10^{-1}$ g/(m²d), for example in a range of approximately $10^{-4}$ g/(m²d) to approximately $10^{-10}$ g/(m²d), for example in a range of approximately $10^{-4}$ g/(m²d) to approximately $10^{-6}$ g/(m²d). A substance that is hermetically impermeable with respect to water or a hermetically impermeable substance mixture includes or is formed from a ceramic, a metal and/or a metal oxide.

In various developments, the encapsulation structure includes a barrier thin-film layer, a coupling-out layer, a connection layer, a getter and/or a cover. The encapsulation structure surrounds the first electrode layer 108, the organic functional layer structure 120 and the second electrode layer 116.

The barrier thin-film layer includes or is formed from one of the following materials: aluminum oxide, zinc oxide, zirconium oxide, titanium oxide, hafnium oxide, tantalum oxide, lanthanum oxide, silicon oxide, silicon nitride, silicon carbide, silicon oxynitride, indium tin oxide, indium zinc oxide, aluminum-doped zinc oxide, poly(p-phenylene terephthalamide), Nylon 66, and mixtures and alloys thereof.

The coupling-in/coupling-out layer includes a matrix and scattering centers distributed therein with respect to the electromagnetic radiation, wherein the average refractive index of the coupling-in/coupling-out layer is greater or less than the average refractive index of the layer from which the electromagnetic radiation is provided. Furthermore, in addition, one or a plurality of antireflection layers (for example combined with the second barrier thin-film layer) can be provided in the organic optoelectronic assembly.

The connection layer is formed from an adhesive or a lacquer. In one development, a connection layer composed of a transparent material includes particles which scatter electromagnetic radiation, for example light-scattering particles. As a result, the connection layer acts as a scattering layer, which leads to an improvement in the color angle distortion and the coupling-out efficiency.

In one development, between the second electrode layer 116 and the connection layer, an electrically insulating layer (not illustrated) is also formed, for example SiN, for example having a layer thickness in a range of approximately 300 nm to approximately 1.5 μm, for example having a layer thickness in a range of approximately 500 nm to approximately 1 μm, in order to protect electrically unstable materials, for example during a wet-chemical process.

The layer including getter includes or is formed from a material that absorbs and binds substances that are harmful to the electrically active region, for example water vapor and/or oxygen. A getter includes or is formed from a zeolite derivate, for example. The layer including getter has a layer thickness of greater than approximately 1 μm, for example a layer thickness of a plurality of μm.

The cover is formed or arranged on or above the connection layer. The cover is connected to the second electrode layer 116 by means of the connection layer and protects the first electrode layer 108, the organic functional layer structure 120 and the second electrode layer 116 from harmful substances. The cover is for example a glass cover, a metal film cover or a sealed plastics film cover. The glass cover is connected for example by means of frit bonding (glass frit bonding/glass soldering/seal glass bonding) by means of a conventional glass solder in the geometric edge regions of the organic optoelectronic component.

Furthermore, contact pads are provided, by means of which the light-emitting component 100 can be connected to a component-external electrical energy source (not illustrated). The contact pads are arranged outside the encapsulation structure and are electrically connected to the electrode layers 108, 116 through the encapsulation structure, for example by means of electrically conductive and electrically conducting connection layers. The electrically conducting connection layers include for example a layer sequence, for example: Mo/Al/Mo; Cr/Al/Cr or Ag/Mg; or are formed from an individual layer, for example Al.

A first electrical potential can be applied to the first contact pad, which is connected to the first electrode layer 108. The first electrical potential is provided by the component-external electrical energy source, for example a current source or a voltage source. Alternatively, the first electrical potential is applied to an electrically conductive carrier 106 and is directly electrically fed to the first electrode layer 108 through the carrier 106. The first electrical potential is for example the ground potential or some other predefined reference potential.

A second electrical potential can be applied to the second contact pad, which is connected to the second electrode layer 116. The second electrical potential is provided by the same component-external electrical energy source as, or a different component-external electrical energy source than, the first electrical potential. The second electrical potential is different than the first electrical potential. The second electrical potential has for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

In various developments, individual electrically conductive layers which are intended not to be directly in physical contact but are intended to be electrically connected to one another indirectly are physically separated from one another by means of an electrical insulation structure. By way of example, the insulation structure includes or is formed from a resist, for example a polyimide.

Figure 2:
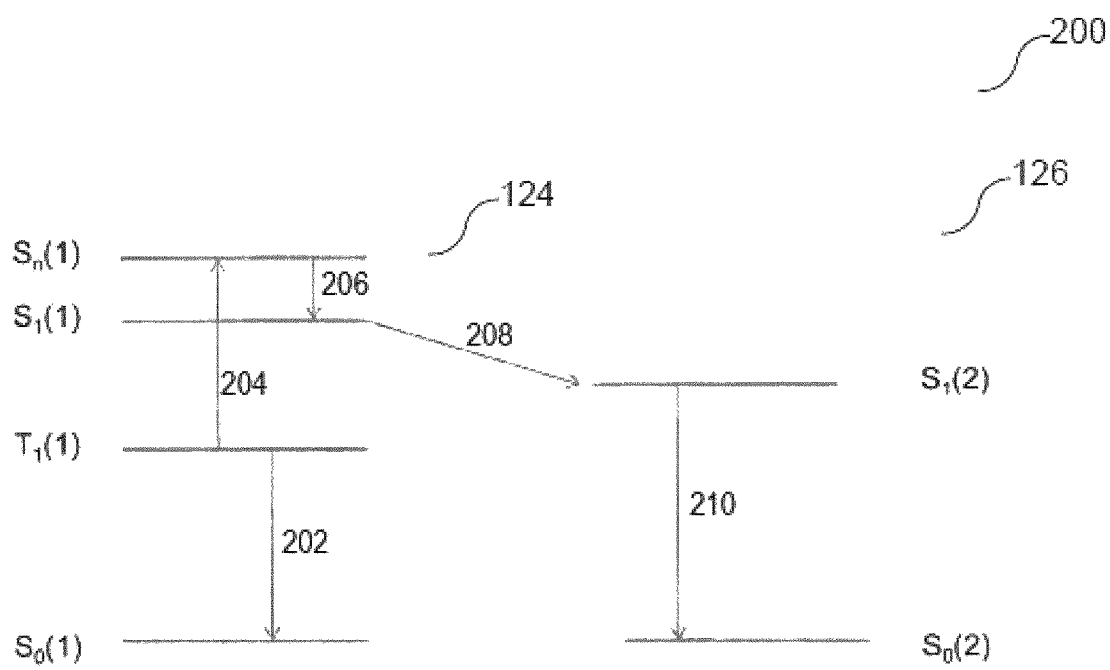
FIG. 2 schematically illustrates a Jablonski scheme for the first emitter material and the second emitter material of a light-emitting component in accordance with various developments.

FIG. 2 schematically illustrates a Jablonski scheme 200 or a Jablonski diagram 200 for the first emitter material 124 and the second emitter material 126 of a light-emitting component in accordance with various developments, such as are provided for example in the emitter layer of the light-emitting component described above.

The designations hereinafter: first, second or third excited state serve merely for describing the excitation process, and are not intended to indicate the energetic position of the excited states with respect to one another or in relation to further undescribed states and/or transition processes.

The first emitter material 124 has a ground state $S_0(1)$. The ground state $S_0(1)$ is a singlet state, for example. Furthermore, the first emitter material 124 has a first excited state. The first excited state is a triplet state $T_1(1)$, for example. In various embodiments, this state can also have a higher multiplicity and be for example a quintet or septet state. The first emitter material 124 can be phosphorescent. The first electromagnetic radiation 128 is generated upon a transition (illustrated in FIG. 2 by means of the arrow 202) from the first excited state $T_1(1)$ to the ground state $S_0(1)$. In other words: the first electromagnetic radiation 128 is a phosphorescence radiation.

The first emitter material 124 furthermore has a second excited state $S_n(1)$. The second excited state $S_n(1)$ is a singlet state, for example. The second excited state $S_n(1)$ lies energetically above the first excited state $T_1(1)$. An electron can, for example at high triplet densities (high number of occupied triplet states), by means of a triplet-triplet annihilation (TTA), transition from the first excited state $T_1(1)$ inter alia to the second excited state $S_n(1)$ (illustrated by means of the arrow 204 in FIG. 2). This can involve a bimolecular process in which a further state of higher multiplicity arises besides the second excited state $S_n(1)$.

The first emitter material 124 furthermore has a third excited state $S_1(1)$. The third excited state $S_1(1)$ is a singlet state, for example. The third excited state $S_1(1)$ lies energetically between the second excited state $S_n(1)$ and the first excited state $T_1(1)$. An electron can transition by means of internal conversion, that is to say in a radiationless fashion, from the second excited state to the third excited state (illustrated by means of the arrow 206 in FIG. 2).

The second emitter material 126 has a ground state $S_0(2)$. The ground state $S_0(2)$ is a singlet state, for example.

Furthermore, the second emitter material 126 has an excited state $S_1(2)$. The excited state $S_1(2)$ is a singlet state, for example. The second emitter material 126 can be fluorescent. The second electromagnetic radiation 130 is generated upon a transition (illustrated by means of the arrow 210 in FIG. 2) from the excited state $S_1(2)$ of the second emitter material 126 to the ground state $S_0(2)$ of the second emitter material. In other words: the second electromagnetic radiation 130 is a fluorescence radiation.

The excited state $S_1(2)$ of the second emitter material 126 lies energetically between the second excited state $S_n(1)$ and/or the third excited state $S_1(1)$ of the first emitter material 124 and the first excited state $T_1(1)$ of the first emitter material 124. When the second emitter material 126 is in spatial proximity to the first emitter material 124, such as, for example, in the first display region 102 (see FIG. 1), a transition (illustrated by means of the arrow 208 in FIG. 2) of an electron from the third excited state $S_1(1)$ of the first emitter material 124 to the excited state $S_1(2)$ of the second emitter material 126 can take place. In other words: the second emitter material 126 emits second electromagnetic radiation 130 by means of a cascade-like excitation process of the first emitter material 124, and is not excited directly by means of an electric current from the first electrode layer 108 through the organic functional layer structure 120 to the second electrode layer 116.

In other words:

The occupation of the light-emitting state $S_1(2)$ of the second emitter material 126 is achieved by using the concept of triplet-triplet annihilation upon the transition 204 from the first excited state $T_1(1)$ to the second excited state $S_n(1)$ of the first emitter material 124. The first emitter material 124 is chosen in such a way that the light-emitting first excited state $T_1(1)$ has a higher multiplicity than the ground state $S_0(1)$; by way of example, the first emitter material 124 is a triplet emitter having a long phosphorescence decay duration. The phosphorescence decay duration is for example greater than 10 µs, for example greater than 50 µs, for example greater than 100 µs, for example greater than 1 ms. Such a decay time can be realized for example by means of PtOEP or a europium compound as the first emitter material 124.

In the case of an electric current having a high current density, on account of the long decay duration from the first excited state $T_1(1)$ of the first emitter material 124, it is no longer possible for all the triplets formed (molecules in the first excited state $T_1(1)$) to decay radiatively. The triplets are quenched, advantageously reciprocally, to form more highly energetic states (molecules in excited states of other spin multiplicity). As a result, molecules in the excited and non-light-emitting singlet state $S_n(1)$ arise in part in the first emitter material 124. This process is referred to as triplet-triplet annihilation (TTA). The state $S_n(1)$ subsequently transitions, for example by means of internal conversion, to the energetically lower state $S_1(1)$ with identical spin multiplicity. The second emitter material 126 is chosen with respect to the first emitter material 124 in such a way that the second emitter material 126 has a light-emitting, excited singlet state $S_1(2)$ energetically below the state $S_n(1)$ generated by TTA and subsequent internal conversion, i.e. energetically below the second excited state $S_n(1)$. The excited state $S_1(2)$ of the second emitter material 126 can then be occupied by intermolecular energy transfer processes from $S_n(1)$ and subsequently decay radiatively by means of emission of the second electromagnetic radiation 130 (i.e. an electron passes to an energetically lower state with emission of an electromagnetic radiation).

The second emitter material 126 has a higher emission energy (energy of the transition 210) than the first emitter material 124 for the transition 202 from the first excited state to the ground state, whereby the resulting color of the emitted light in the first display region 102 changes, for example the superimposition of the first electromagnetic radiation 128, for example red, and the second electromagnetic radiation 130, for example green, results in a mixed light 132, for example a yellow light. By way of example, only emission from the first excited state $T_1(1)$ of the first emitter material 124 occurs to an appreciable extent at current densities below 1 mA/cm² and emission also from the excited state of the second emitter material 126 occurs starting from a current density of 1 mA/cm², for example from 10 mA/cm².

In other words:

The light-emitting component 100 includes an emitter layer 112. The emitter layer 112 includes a first emitter material 124 and a second emitter material 126. The emitter layer 112 includes at least one predefined first display region 102 and a second display region 104. The first display region 102 includes the first emitter material 124 and the second emitter material 126. The second display region 104 includes the first emitter material 124 and is substantially free of the second emitter material 126. The first emitter material 124 has at least one first excited state $T1(1)$ and a second excited state $S1(1)$, wherein the second excited state $S1(1)$ is energetically above the first excited state $T1(1)$, and a first electromagnetic radiation 128 is emitted upon the transition 202 of an electron from the first excited state $T1(1)$ to the ground state $S0(1)$ of the first emitter material 124. The second emitter material 126 has at least one excited state $S1(2)$, wherein a second electromagnetic radiation 130 is emitted upon the transition 210 of an electron from the excited state $S1(2)$ of the second emitter material 126 to the ground state $S0(2)$ of the second emitter material 126. The excited state $S1(2)$ of the second emitter material 126 is occupied substantially by means of an energy transfer 208 from the second excited state $S1(1)$ of the first emitter material 124 to the excited state $S1(2)$ of the second emitter material 126. Consequently, a mixed light 132 composed of first electromagnetic radiation 128 and second electromagnetic radiation 130 is emittable from the first display region 102. The light that is emittable from the second display region 104 is substantially free of second electromagnetic radiation 130.

In accordance with one development, the first emitter material 124 furthermore has at least one third excited state $Sn(1)$, which lies energetically above the second excited state $S1(1)$, wherein the second excited state $S1(1)$ is occupied from the third excited state $Sn(1)$, for example by means of internal conversion.

In accordance with one development, the third excited state $Sn(1)$ is occupied by means of a bimolecular quenching process of first excited states $T1(1)$.

In accordance with one development, the emitter layer 112 includes a matrix material 122, wherein the first emitter material 124 and the second emitter material 126 are distributed in the matrix material 122.

In various developments, the light emittable by the second display region 104 substantially only includes the first electromagnetic radiation 128.

In various developments, the energy level of the excited state $S1(2)$ of the second emitter material 126 is energetically between the energy level of the first excited state $T1(1)$ and the energy level of the second excited state $S1(1)$ of the first emitter material 124.

In various developments, the energy difference between the excited state $S1(2)$ of the second emitter material 126 and the ground state $S0(2)$ of the second emitter material 126 is greater than the energy difference between the first excited state $T1(1)$ of the first emitter material 124 and the ground state $S0(1)$ of the first emitter material 124.

In various developments, the first display region 102 and the second display region 104 are arranged alongside one another.

In various developments, the first emitter material 124 is a phosphorescent material, and the first electromagnetic radiation 128 is a phosphorescent light.

In various developments, the second emitter material 126 is a fluorescent material, and the second electromagnetic radiation 130 is a fluorescent light.

In various developments, the first display region 102 and the second display region 104 are arranged with respect to one another such that predefined information is representable by means of the arrangement during energized operation of the light-emitting component 100. In various developments, the arrangement embodies the form of lettering, of a pictogram, of a logo, of an ideogram and/or of a symbol.

Figure 3:
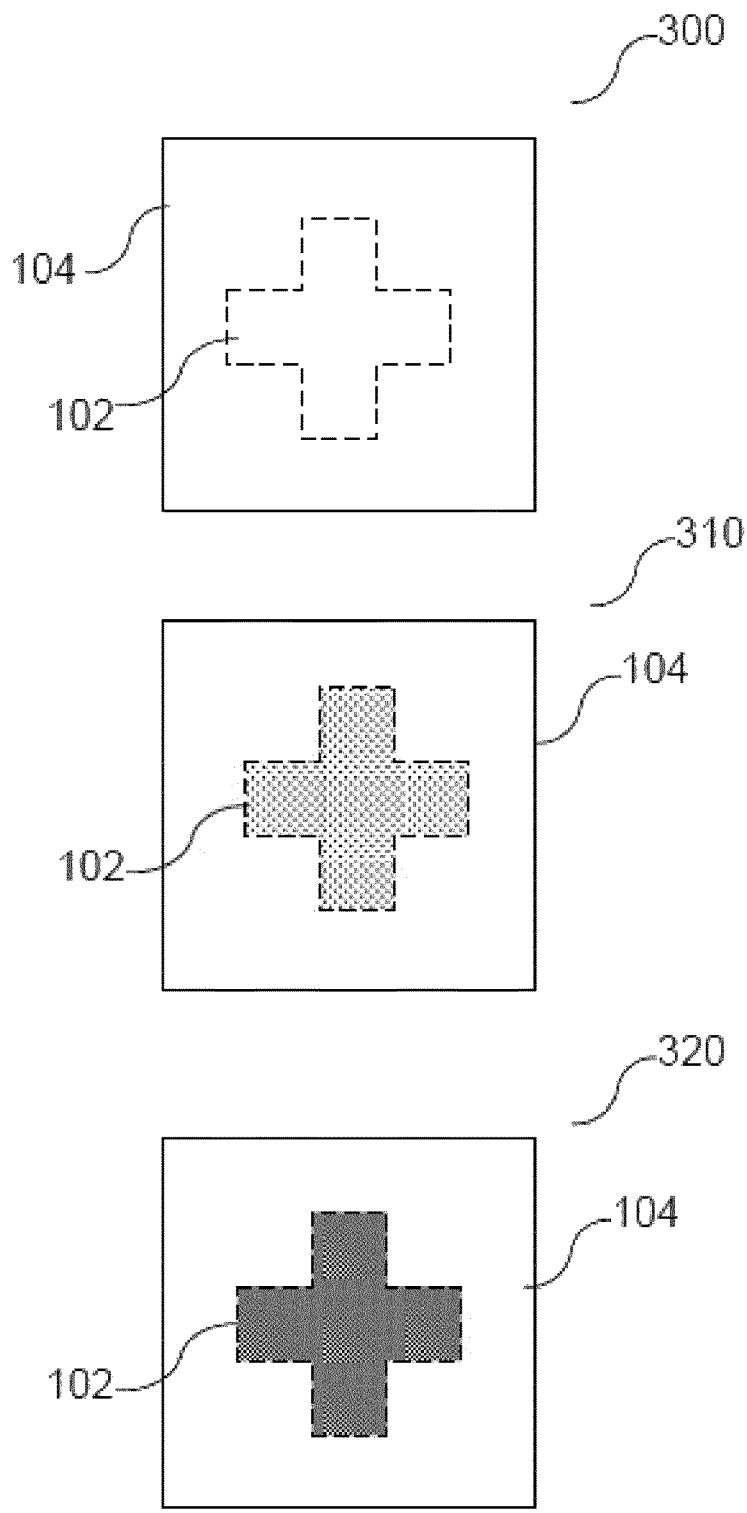
FIG. 3 illustrates different operating modes of a light-emitting component in accordance with one embodiment.

FIG. 3 illustrates different operating modes 300, 310, 320 of a light-emitting component in accordance with one embodiment. The light-emitting component illustrated in FIG. 3 can substantially correspond to a light-emitting component described above.

In the operating modes 300, 310, 320 illustrated in FIG. 3, an electric current flows from the first electrode layer 108 through the organic functional layer structure 120 to the second electrode layer 116, and/or vice versa. The current flow of the electric current is generated by means of a component-external electrical energy source that is electrically connected to the electrode layers 108, 116 of the light-emitting component. In the operating modes 300, 310, 320, the electric current is configured in each case in such a way that the emitter layer of the light-emitting component emits an electromagnetic radiation.

In various developments, the second emitter material 126 in the first display region 102 is distributed homogeneously in the matrix material 122 (illustrated for example in FIG. 3). Alternatively, the second emitter material 126 in the first display region 102 is distributed inhomogeneously in the matrix material 122 (illustrated for example in FIG. 4).

The emitter layer 120 is structured for example in such a way that the first display region 102 has a cross shape surrounded by the second display region 104, such that a cross character or a plus character is representable as information in an electrically switchable manner.

In a first operating mode 300, the electric current is set in such a way that the first emitter material 124 emits the first electromagnetic radiation 128 for example weakly or with low intensity. The second emitter material is substantially not excited. By way of example, the electric current in the first operating mode 300 is so low that the triplet density in the first excited state of the first emitter material 124 is low, such that the second emitter material 126 is substantially not excited (see also FIG. 2). Consequently, in the first operating mode 300, substantially only first electromagnetic radiation 128 is emitted by the light-emitting component from the first display region 102 and the second display region 104.

In a second operating mode 310, the electric current is set in such a way that the first emitter material 124 emits the first electromagnetic radiation 128 and part of the second emitter material 126 is excited and emits second electromagnetic radiation 130 (see also FIG. 2). By way of example, the electric current, for example the electrical voltage, the electric current intensity and/or the electric current density, in the second operating mode 310 is greater than in the first operating mode 300. Consequently, in the second operating mode 310, the light-emitting component emits a mixed light 132 composed of first electromagnetic radiation 128 and second electromagnetic radiation 130 from the first display region 102, and emits substantially only first electromagnetic radiation 128 from the second display region 104.

In other words: in the first operating mode 300, the structuring of the display region of the light-emitting component is optically invisible with respect to the electromagnetic radiation emitted by the light-emitting component. In the second operating mode 310, the structuring of the display region of the light-emitting component is optically visible by virtue of a mixed light 132 including first electromagnetic radiation 128 and second electromagnetic radiation 130 being emitted by the first display region 102, and substantially only the first electromagnetic radiation 128 being emitted from the second display region 104. An optically visible contrast, for example a color contrast, a brightness contrast, a saturation contrast or the like, is thus generated between the first display region 102 and the second display region 104 by means of the electric current.

In a third operating mode 320, with respect to the second operating mode 310, by means of a further change in the properties of the electric current, for example an increase in the electrical voltage, the electric current density and/or the electric current intensity, the optically visible contrast between the first display region 102 and the second display region 104 can be amplified further; by way of example, the difference in color locus of the light emitted by the first display region 102 and the second display region 104 can be increased. By way of example, the triplet density of the first excited state of the first emitter material 124 can be increased by means of a higher current intensity of the electric current. As a result, the proportion of second electromagnetic radiation 130 in the mixed light 132 can be increased. For the case where the first electromagnetic radiation 128 and the second electromagnetic radiation 130 have a different color locus, the proportion of the second electromagnetic radiation 130 in the mixed light 132 can be increased by means of the higher current intensity, as a result of which the color locus of the mixed light 132 is shifted.

In other words: the above-described light-emitting component having the emitter layer including the first display region and the second display region can be operated by forming an electric current having a current density through the emitter layer (first operating mode 300). At the current density the first emitter material emits the first electromagnetic radiation and the second emitter material is non-light-emitting, that is to say that the excited state of the second emitter material is not occupied, or not occupied to an appreciable extent.

Furthermore, operating the light-emitting component may include changing the first current density to a second current density (second operating mode 310 and/or third operating mode 320), wherein at the second current density the first emitter material emits the first electromagnetic radiation and the second emitter material emits the second electromagnetic radiation.

Figure 4:
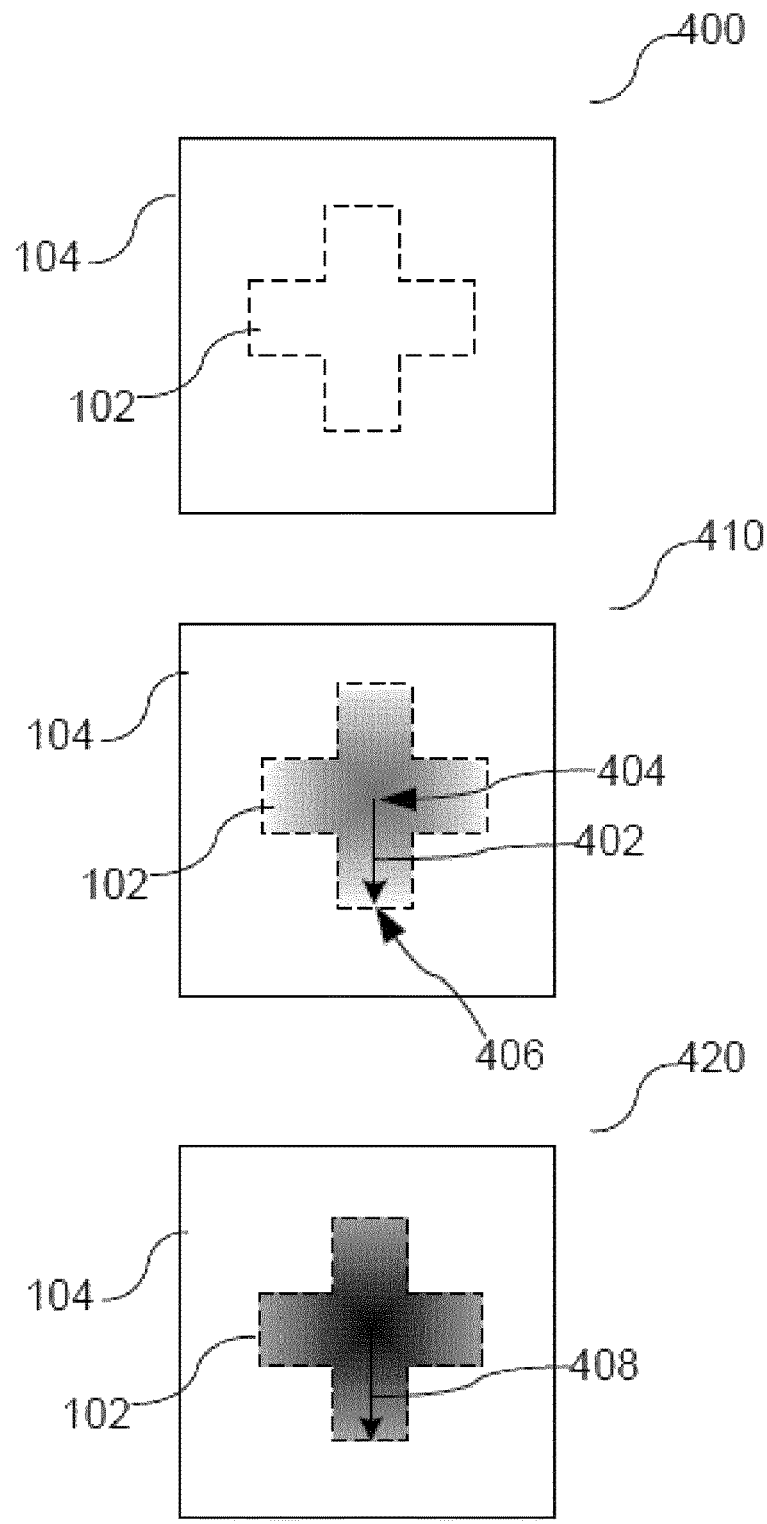
FIG. 4 illustrates different operating modes of a light-emitting component in accordance with a further embodiment.

FIG. 4 illustrates different operating modes 400, 410, 420 of a light-emitting component in accordance with a further embodiment. The light-emitting component illustrated in FIG. 4 can substantially correspond to a light-emitting component described above.

In the operating modes 400, 410, 420 illustrated in FIG. 4, an electric current flows through the light-emitting component as described in FIG. 3.

Unlike in the embodiment of a light-emitting component as illustrated in FIG. 3, the embodiment illustrated in FIG. 4 has an inhomogeneous distribution of second emitter material 126 in the first display region 102. The inhomogeneous distribution of the second emitter material 126 has for example a number density gradient (illustrated in FIG. 4 as an intensity gradient by means of the arrow 402, 408) of second emitter material 126 in the matrix. The emitter layer is formed in a structured fashion for example in such a way that the number density of second emitter material 126 decreases for example from the center 404 of the first display region 102 to the edge 406 of the first display region 102.

In other words: in various developments, the first display region 102 has a number density gradient of second emitter material 126 in the matrix material 122. By means of the number density gradient it is possible to realize an intensity gradient 402, 408 of the second electromagnetic radiation in the first display region 102.

In a first operating mode 400 of the light-emitting component with inhomogeneous distribution of the second emitter material in the first display region, the electric current is set as in the first operating mode 300 in FIG. 3.

In a second operating mode 410, the electric current is set as in the second operating mode 310 in FIG. 3. By means of the inhomogeneous distribution of the second emitter material 126 in the matrix material of the emitter layer 120 in the first display region 102, mixed light 132 that is inhomogeneous is emitted in the first display region 102. In other words: the mixed light 132 has in the first display region 102 an inhomogeneity, for example a local color locus contrast, for example a distribution of color loci. By way of example, the proportion of second electromagnetic radiation 130 in the mixed light 130 changes in accordance with the number density gradient of the second emitter material 126 in the first display region 102, such that a mixed light 132 having a lateral color locus gradient 402 with respect to the first display region 102 is generated for example in the first display region 102. In this case, the intensity gradient of the second electromagnetic radiation brings about a color locus gradient of the mixed light.

In a third operating mode 420, the electric current is set as in the third operating mode 320 in FIG. 3. For the case where the first electromagnetic radiation 128 and the second electromagnetic radiation 130 have a different color locus, the proportion of the second electromagnetic radiation 130 in the mixed light 132 can be increased by means of the higher current intensity, as a result of which, for example, visibility or intensity of the mixed light 132 with the color locus gradient 408 can be amplified.

In other words: if the current density is increased, a color gradient becomes realizable in the display region of the light-emitting component. The information to be represented, for example the symbol to be represented, can be inserted, by means of the current density, continuously variably in an electrically settable manner in the display region of the light-emitting component. In this way, by means of the number density gradient of the second emitter material 126 in further applications by way of the change of the symbol (smaller/larger) or additionally appearing luminous regions, it is possible to represent different items of information.

Figure 5:
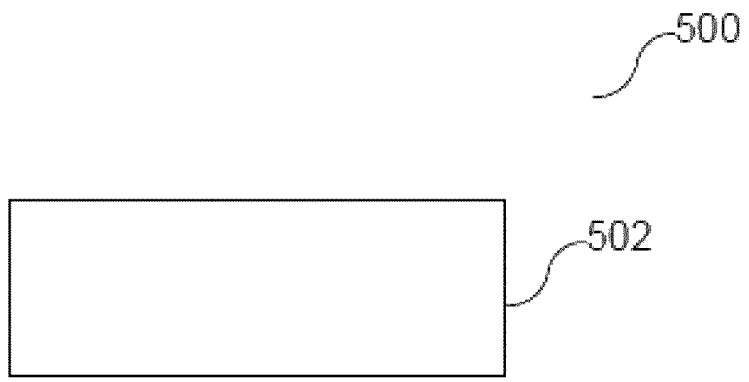
FIG. 5 illustrates part of a flow diagram of a method for producing a light-emitting component in accordance with various developments.

FIG. 5 illustrates part of a flow diagram of a method for producing a light-emitting component in accordance with various developments.

The light-emitting component is formed with an emitter layer including at least one first display region and a second display region, wherein the first display region includes at least one first emitter material and a second emitter material, and the second display region includes the first emitter material and is substantially free of second emitter material.

In the method 500 for producing a light-emitting component having an emitter layer, forming the emitter layer includes forming 502 the emitter layer with a first emitter material and a second emitter material. The emitter layer is formed with at least one predefined first display region and a second display region.

By way of example, forming the emitter layer includes forming 502 a matrix material, and distributing a first emitter material and a second emitter material in the matrix material.

In the first display region, the first emitter material and the second emitter material are formed, arranged or deposited, for example in a manner distributed in the matrix material.

In the second display region, the first emitter material is formed, arranged or deposited, for example in a manner distributed in the matrix material, and the second display region, for example the matrix material in the second display region, is substantially free of the second emitter material.

The first emitter material has at least one first excited state and a second excited state, wherein the second excited state is energetically above the first excited state, and a first electromagnetic radiation is emitted upon the transition from the first excited state to the ground state of the first emitter material. The second emitter material has at least one excited state, wherein a second electromagnetic radiation is emitted upon the transition from the excited state of the second emitter material to the ground state of the second emitter material. The excited state of the second emitter material is occupied substantially by means of an energy transfer from the second excited state of the first emitter material to the excited state of the second emitter material in such a way that a mixed light composed of first electromagnetic radiation and second electromagnetic radiation is emittable from the first display region, and the light that is emittable from the second display region is substantially free of second electromagnetic radiation.

The present disclosure is not restricted to the embodiments specified. By way of example, the emitter layer may include at least one further emitter material that is excited like the second emitter material, for example by means of a radiationless transition from an excited state of the second emitter material to an excited state of the third emitter material and/or by means of a radiationless transition from an excited state of the first emitter material to an excited state of the third emitter material. The third emitter material can emit for example a third electromagnetic radiation, which is substantially different than the first electromagnetic radiation and/or the second electromagnetic radiation. The third emitter material can be a fluorescent or phosphorescent material.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A light-emitting component comprising an emitter layer,
    wherein the emitter layer comprises a phosphorescent emitter material and a fluorescent emitter material, and
    wherein the emitter layer has at least one predefined first display region and a second display region,
        wherein the first display region comprises the phosphorescent emitter material and a doping with fluorescent emitter material, and
        wherein the second display region comprises the phosphorescent emitter material and is substantially free of the fluorescent emitter material;
    wherein the phosphorescent emitter material has at least one first excited state and a second excited state, wherein the second excited state is energetically above the first excited state, and a first electromagnetic radiation is emitted upon the transition from the first excited state to the ground state of the phosphorescent emitter material, and
    wherein the fluorescent emitter material has at least one excited state, wherein a second electromagnetic radiation is emitted upon the transition from the excited state of the fluorescent emitter material to the ground state of the fluorescent emitter material; and
    wherein the excited state of the fluorescent emitter material is occupied substantially by means of an energy transfer from the second excited state of the phosphorescent emitter material to the excited state of the fluorescent emitter material in such a way that a mixed light composed of first electromagnetic radiation and second electromagnetic radiation is emittable from the first display region, and the light that is emittable from the second display region is substantially free of second electromagnetic radiation.

2. The light-emitting component as claimed in claim 1, wherein the phosphorescent emitter material further comprises at least one third excited state, which lies energetically above the second excited state, wherein the second excited state is occupied from the third excited state.

3. The light-emitting component as claimed in claim 2, wherein the third excited state is occupied by means of a bimolecular quenching process of first excited states.

4. The light-emitting component as claimed in claim 2, wherein the energy level of the excited state of the fluorescent emitter material is energetically between the energy level of the first excited state and the energy level of the second excited state of the phosphorescent emitter material.

5. The light-emitting component as claimed in claim 2, wherein the energy difference between the excited state of the fluorescent emitter material and the ground state of the fluorescent emitter material is greater than the energy difference between the first excited state of the phosphorescent emitter material and the ground state of the phosphorescent emitter material.

6. The light-emitting component as claimed in claim 1, wherein the emitter layer comprises a matrix material and the phosphorescent emitter material and the fluorescent emitter material are distributed in the matrix material.

7. The light-emitting component as claimed in claim 1, wherein the light emittable by the second display region substantially only comprises the first electromagnetic radiation.

8. The light-emitting component as claimed in claim 1, wherein the energy level of the excited state of the fluorescent emitter material is energetically between the energy level of the first excited state and the energy level of the second excited state of the phosphorescent emitter material.

9. The light-emitting component as claimed in claim 1, wherein the energy difference between the excited state of the fluorescent emitter material and the ground state of the fluorescent emitter material is greater than the energy difference between the first excited state of the phosphorescent emitter material and the ground state of the phosphorescent emitter material.

10. The light-emitting component as claimed in claim 1, wherein the first display region and the second display region are arranged alongside one another.

11. The light-emitting component as claimed in claim 10, wherein the first display region and the second display region are arranged with respect to one another such that predefined information is representable by means of the arrangement during energized operation of the light-emitting component.

12. The light-emitting component as claimed in claim 11, wherein the arrangement embodies the form of lettering, of a pictogram, of a logo, of an ideogram and/or of a symbol.

13. The light-emitting component as claimed in claim 11, wherein the fluorescent emitter material in the first display region is distributed inhomogeneously in the matrix material.

14. The light-emitting component as claimed in claim 1, wherein the fluorescent emitter material in the first display region is distributed homogeneously in the matrix material.

15. The light-emitting component as claimed in claim 1, wherein the fluorescent emitter material in the first display region is distributed inhomogeneously in the matrix material.

16. The light-emitting component as claimed in claim 15, wherein the first display region has a number density gradient of second emitter material in the matrix material.

17. A method for operating a light-emitting component as claimed in claim 1, the method comprising:

forming an electric current having a current density through the emitter layer, wherein at the current density the phosphorescent emitter material emits the first electromagnetic radiation and the fluorescent emitter material is non-light-emitting.

18. The method as claimed in claim 17, further comprising:
changing the current density to a second current density, wherein at the second current density the phosphorescent emitter material emits the first electromagnetic radiation and the fluorescent emitter material emits the second electromagnetic radiation.

19. The light-emitting component as claimed in claim 1, wherein the first display region and the second display region are arranged with respect to one another such that predefined information is representable by means of the arrangement during energized operation of the light-emitting component.

20. A method for producing a light-emitting component having an emitter layer,
wherein forming the emitter layer is carried out with a phosphorescent emitter material and a fluorescent emitter material;
wherein the emitter layer is formed at least with a predefined first display region and a second display region,
wherein the phosphorescent emitter material and a doping composed of fluorescent emitter material in the matrix material are arranged in the first display region, and
wherein the phosphorescent emitter material is arranged in the second display region and the second display region is substantially free of the fluorescent emitter material;
wherein the phosphorescent emitter material has at least one first excited state and a second excited state, wherein the second excited state is energetically above the first excited state, and a first electromagnetic radiation is emitted upon the transition from the first excited state to the ground state of the phosphorescent emitter material, and
wherein the fluorescent emitter material has at least one excited state, wherein a second electromagnetic radiation is emitted upon the transition from the excited state of the fluorescent emitter material to the ground state of the fluorescent emitter material; and
wherein the excited state of the fluorescent emitter material is occupied substantially by means of an energy transfer from the second excited state of the phosphorescent emitter material to the excited state of the fluorescent emitter material in such a way that a mixed light composed of first electromagnetic radiation and second electromagnetic radiation is emittable from the first display region, and the light that is emittable from the second display region is substantially free of second electromagnetic radiation.

* * * * *